United States Patent
Matsuoka et al.

(10) Patent No.: US 9,117,764 B2
(45) Date of Patent: Aug. 25, 2015

(54) ETCHING METHOD, SUBSTRATE PROCESSING METHOD, PATTERN FORMING METHOD, METHOD FOR MANUFACTURING SEMICONDUCTOR ELEMENT, AND SEMICONDUCTOR ELEMENT

(75) Inventors: Takaaki Matsuoka, Tokyo (JP); Toshihisa Nozawa, Miyagi (JP); Toshiyasu Hori, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 214 days.

(21) Appl. No.: 13/819,038

(22) PCT Filed: Jul. 29, 2011

(86) PCT No.: PCT/JP2011/067452
§ 371 (c)(1),
(2), (4) Date: Feb. 26, 2013

(87) PCT Pub. No.: WO2012/026286
PCT Pub. Date: Mar. 1, 2012

(65) Prior Publication Data
US 2013/0157468 A1    Jun. 20, 2013

(30) Foreign Application Priority Data
Aug. 27, 2010    (JP) .................. 2010-190944

(51) Int. Cl.
*H01L 21/302*    (2006.01)
*H01L 21/308*    (2006.01)
(Continued)

(52) U.S. Cl.
CPC .......... *H01L 21/3081* (2013.01); *G03F 7/0046* (2013.01); *G03F 7/0752* (2013.01);
(Continued)

(58) Field of Classification Search
CPC ............... H01L 21/3086; H01L 21/31122; H01L 21/3081; H01L 21/276; H01L 21/2274; H01L 21/3127; H01L 21/0212
USPC .................................. 438/694, 703
See application file for complete search history.

(56) References Cited

U.S. PATENT DOCUMENTS 6,211,065 B1 *   4/2001   Xi et al. .............. 438/627
6,787,445 B1 *   9/2004   Jiwari et al. ............ 438/623

(Continued)

FOREIGN PATENT DOCUMENTS

CN       1998086      7/2007
JP       11-31678 A   2/1999

(Continued)

OTHER PUBLICATIONS

International Search Report mailed Nov. 8, 2011 in PCT/JP2011/067452.

*Primary Examiner* — Savitr Mulpuri
(74) *Attorney, Agent, or Firm* — Rothwell, Figg, Ernst & Manbeck, P.C.

(57) ABSTRACT

A fluorocarbon layer is formed on a silicon substrate that is a to-be-processed substrate (step A). A resist layer is formed on the thus-formed fluorocarbon layer (step B). Then, the resist layer is patterned into a predetermined shape by exposing the resist layer to light by means of a photoresist layer (step C). The fluorocarbon layer is etched using the resist layer, which has been patterned into a predetermined shape, as a mask (step D). Next, the resist layer served as a mask is removed (step E). After that, the silicon substrate is etched using the remained fluorocarbon layer as a mask (step F). Since the fluorocarbon layer by itself functions as an antireflective film and a harm mask, the reliability of processing can be improved, while reducing the cost.

5 Claims, 11 Drawing Sheets

(51) Int. Cl.

| | |
|---|---|
| *H01J 37/32* | (2006.01) |
| *H01L 21/02* | (2006.01) |
| *H01L 21/027* | (2006.01) |
| *H01L 21/311* | (2006.01) |
| *G03F 7/004* | (2006.01) |
| *G03F 7/075* | (2006.01) |
| *G03F 7/09* | (2006.01) |
| *G03F 7/20* | (2006.01) |

(52) U.S. Cl.
CPC .......... *G03F 7/094* (2013.01); *G03F 7/2041* (2013.01); *H01J 37/32192* (2013.01); *H01L 21/0212* (2013.01); *H01L 21/0276* (2013.01); *H01L 21/02274* (2013.01); *H01L 21/3086* (2013.01); *H01L 21/31122* (2013.01)

(56) References Cited

U.S. PATENT DOCUMENTS

| | | | | |
|---|---|---|---|---|
| 7,235,478 | B2 * | 6/2007 | Geng et al. | 438/634 |
| 7,807,578 | B2 * | 10/2010 | Bencher et al. | 438/703 |
| 8,128,831 | B2 * | 3/2012 | Sato et al. | 216/41 |
| 8,470,187 | B2 * | 6/2013 | Ha | 216/37 |
| 8,901,016 | B2 * | 12/2014 | Ha et al. | 438/785 |
| 2004/0157466 | A1 * | 8/2004 | Xu et al. | 438/758 |
| 2006/0273456 | A1 * | 12/2006 | Sant et al. | 257/734 |
| 2007/0048625 | A1 * | 3/2007 | Nordquist et al. | 430/5 |
| 2007/0099431 | A1 * | 5/2007 | Li | 438/735 |
| 2007/0259131 | A1 * | 11/2007 | Kobayashi et al. | 427/569 |
| 2008/0064213 | A1 * | 3/2008 | Jung | 438/696 |
| 2008/0246036 | A1 | 10/2008 | Yamazaki et al. | |
| 2008/0299776 | A1 * | 12/2008 | Bencher et al. | 438/703 |
| 2009/0117742 | A1 * | 5/2009 | Jung | 438/694 |
| 2009/0133835 | A1 * | 5/2009 | Nishimoto et al. | 156/345.27 |
| 2009/0206491 | A1 | 8/2009 | Wada et al. | |
| 2010/0068660 | A1 * | 3/2010 | Shibazaki et al. | 430/326 |
| 2010/0224591 | A1 * | 9/2010 | Kondo | 216/41 |
| 2012/0003838 | A1 * | 1/2012 | Ookuma et al. | 438/717 |
| 2013/0189845 | A1 * | 7/2013 | Kim et al. | 438/696 |
| 2014/0175650 | A1 * | 6/2014 | Singh et al. | 257/751 |
| 2015/0041812 | A1 * | 2/2015 | Cheng et al. | 257/57 |

FOREIGN PATENT DOCUMENTS

| | | |
|---|---|---|
| JP | 2004-247216 A | 9/2004 |
| JP | 2005-90987 A | 4/2005 |
| JP | 2005-244203 A | 9/2005 |
| JP | 2006-504807 A | 2/2006 |
| JP | 2009-182181 A | 8/2009 |
| JP | 2009-185316 A | 8/2009 |
| JP | 2009-188403 A | 8/2009 |
| JP | 2010-67979 A | 3/2010 |
| KR | 10-2007-0012352 A | 1/2007 |
| KR | 10-0780199 B1 | 11/2007 |
| WO | 03/067329 A1 | 8/2003 |
| WO | 2005/071756 A1 | 8/2005 |
| WO | 2010/030018 A2 | 3/2010 |

* cited by examiner

ETCHING METHOD, SUBSTRATE PROCESSING METHOD, PATTERN FORMING METHOD, METHOD FOR MANUFACTURING SEMICONDUCTOR ELEMENT, AND SEMICONDUCTOR ELEMENT

CROSS REFERENCE TO RELATED APPLICATIONS

This application is a 35 U.S.C. 371 National Phase Entry Application from PCT/JP2011/067452, filed Jul. 29, 2011, which claims the benefit of Japanese Patent Application No. 2010-190944, filed on Aug. 27, 2010, the disclosures of which are incorporated herein in their entirety by reference.

TECHNICAL FIELD

The present invention relates to an etching method, a substrate processing method, a pattern forming method, a method for manufacturing semiconductor element, and a semiconductor element, and particularly to an etching method, a substrate processing method, a pattern forming method, and a method for manufacturing semiconductor element, that use a plasma processing, and a semiconductor element formed by using the plasma processing.

BACKGROUND ART

A semiconductor element, for example, a large scale integrated circuit (LSI) or a metal oxide semiconductor (MOS) transistor, is manufactured by performing processes, such as an etching, a chemical vapor deposition (CVD) and a sputtering on a semiconductor substrate which becomes as a to-be-processed substrate. For the processes, such as the etching or the sputtering, there are processing methods using plasma as an energy supply source, i.e., a plasma etching, a plasma CVD, a plasma sputtering, and the like.

Here, a technique regarding an etching method in which etching is performed by forming an antireflective film at the time of etching is disclosed in Japanese Patent Laid-Open Publication No. 2009-188403 (Patent Document 1). Patent Document 1 discloses a method in which a characteristic portion within a silicon containing anti reflective coat (ARC) layer while reducing a critical dimension (CD).

PRIOR ART DOCUMENT

Patent Document

Patent Document 1: Japanese Patent Laid-Open Publication No. 2009-188403

SUMMARY OF INVENTION

Problems to be Solved by the Invention

In performing a fine etching in a dimension of 45 nm or less for a to-be-processed substrate, for example, a silicon substrate, three layers of a hard mask layer, an organic film layer (optical distribution layer), and an anti reflective coat (ARC) layer may be occasionally formed to perform an etching. According to such a configuration, since an anti reflective performance needed when exposing a photoresist may be secured, an improvement of, such as, a line width roughness (LWR) in the etching may be achieved.

However, in the etching process, forming of a mask having three-layer structure results in the increase of the number of manufacturing processes or the deterioration of the reproducibility. That is, forming of the three layers in the above-describe etching process is not always desirable in a viewpoint from the reduction of the manufacturing costs or the reliability of the processing.

An object of the present invention is to provide an etching method capable of improving the reliability of the processing while reducing the costs low.

Another object of the present invention is to provide a substrate processing method capable of improving the reliability of the processing while reducing the costs.

Yet another object of the present invention is to provide a pattern forming method capable of improving the reliability of the processing while reducing the costs.

Still yet another object of the present invention is to provide a semiconductor element manufacturing method capable of improving the reliability of the processing while reducing the manufacturing costs.

Still yet another object of the present invention is to provide a semiconductor element that is fabricated highly reliably and inexpensively.

Means to Solve the Problems

An etching method according to the present invention etches a to-be-processed substrate using a fluorocarbon layer patterned on the to-be-processed substrate as a mask.

With this configuration, the fluorocarbon layer by itself functions as an antireflective film and a hard mask. By doing this, since forming of only the fluorocarbon layer is needed in the mask forming process, the reduction of the number of processes and the improvement of the reproducibility may be achieved. Accordingly, according to such an etching method, the reliability of processing may be improved and the costs may be kept low.

At least one of a SiCN layer, a SiCO layer and an amorphous carbon layer may be interposed between the fluorocarbon layer and the to-be-processed substrate.

Further, at least one of a SiCN layer, a SiCO layer and an amorphous carbon layer may be formed above the fluorocarbon layer.

Further, a substrate processing method according to the present invention is a substrate processing method which processes a to-be-processed substrate. The substrate processing method includes: a fluorocarbon layer forming process in which a fluorocarbon (CFx: x is a random number) layer is formed on the to-be-processed substrate, a resist layer forming process in which a resist layer is formed on the fluorocarbon layer; a patterning process in which the resist layer is patterned into a predetermined shape, a fluorocarbon layer etching process in which the fluorocarbon layer is etched using the resist layer patterned into the predetermined shape as a mask, thereby patterning the fluorocarbon layer, and a to-be-processed substrate etching process in which the to-be-processed substrate is etched using the patterned fluorocarbon layer as a mask.

With this configuration, functions as an antireflective film and a hard mask are provided by only a single layer of the fluorocarbon layer. By doing this, since forming of only the fluorocarbon layer is formed in the mask forming process, the reduction of the number of processes and the improvement of the reproducibility may be achieved. Accordingly, according to the substrate processing method, the reliability of processing may be improved and the costs may be reduced.

A process of forming at least one of a SiCN layer, a SiCO layer and an amorphous carbon layer between the fluorocarbon layer and the resist layer may be included.

Further, a process of forming at least one of a SiCN layer, a SiCO layer and an amorphous carbon layer between the fluorocarbon layer and the to-be-processed substrate may be included.

The patterning process may include a liquid immersion exposure process.

As an embodiment, a light source for exposure may be configured to include an ArF excimer laser.

A substrate processing method according to another aspect of the present invention is a method a to-be-processed substrate processing method. The to-be-processed substrate processing method includes: a hard mask layer forming process in which a hard mask layer is formed on the to-be-processed substrate, a fluorocarbon layer forming process in which a fluorocarbon (CFx: x is a random number) layer which is patterned into a predetermined shape is formed on the mask layer after the hard mask layer forming process; a silicon containing film forming process in which a silicon containing film is formed to cover the formed fluorocarbon layer and the hard mask layer exposed between the fluorocarbon layers, after the fluorocarbon layer forming process, a silicon containing film etching process (etch back process) in which an etching is performed to remove the silicon containing film located on the top side of the hard mask layer and on the top side of the fluorocarbon layer while leaving the silicon containing film located on a side wall side of the fluorocarbon layer after the silicon containing film forming process, a fluorocarbon layer etching process in which an etching is performed to remove the fluorocarbon layer located between the side walls after the silicon containing film etching process; a hard mask layer etching process in which the hard mask is etched using the remaining silicon containing film as a mask after fluorocarbon layer etching process, and a to-be-processed substrate etching process in which the to-be-processed substrate is etched using the remained hard mask as a mask after the hard mask etching process.

The silicon containing film may include a $SiO_2$ film.

Further, the hard mask layer may include a SiN film.

Here, the above-described fluorocarbon layer forming process may be performed by plasma CVD.

Further, the fluorocarbon layer forming process may be performed using microwave plasma as a plasma source and using plasma generated by a radial line slot antenna.

Further, the above-described fluorocarbon layer forming process may be configured so that the fluorocarbon layer is formed using $C_5F_8$ gas.

Further, the etching is performed by a plasma etching, more preferably, the etching process may be performed using microwave plasma as a plasma source and using plasma generated by a radial line slot antenna.

A pattern forming method according to yet another aspect of the present invention is a pattern forming method which forms a pattern at the time of etching the to-be-processed substrate. The pattern forming method includes: a fluorocarbon layer forming process in which a fluorocarbon (CFx: x is a random number) layer is formed on the to-be-processed substrate, a resist layer forming process in which a resist layer is formed on the fluorocarbon layer, a patterning process in which the resist layer is patterned into a predetermined shape, and a pattern forming process in which the fluorocarbon layer is etched using the resist layer patterned as a mask to etch a pattern of the fluorocarbon layer, thereby forming a pattern of the fluorocarbon layer at the time of etching the to-be-processed substrate.

A pattern forming method according to still yet another aspect of the present invention is a pattern forming method which forms a pattern at the time of etching a to-be-processed substrate. The pattern etching method includes: a hard mask layer forming process in which a hard mask layer is formed on a to-be-processed substrate, a fluorocarbon layer forming process in which a fluorocarbon (CFx: x is a random number) layer patterned into a predetermined shape is formed on the hard mask layer after the hard mask layer forming process, a silicon containing film forming process in which a silicon containing film is formed to cover the formed fluorocarbon layer and the hard mask layer exposed between the fluorocarbon layers after the fluorocarbon layer forming process, a silicon containing film etching process in which an etching is performed to remove the silicon containing film located on the top side of the hard mask layer and on the top side of the fluorocarbon layer while leaving the silicon containing film located on a side wall side of the fluorocarbon layer after the silicon containing film forming process, and a pattern forming process in which the hard mask is etched to remove the fluorocarbon layer located between the side walls, thereby forming a pattern of the fluorocarbon layer at the time etching the to-be-processed substrate after the silicon containing film etching process.

A semiconductor element manufacturing method according to still yet another aspect of the present invention is a semiconductor element manufacturing method in which a to-be-processed substrate is etched to manufacture a semiconductor element. The semiconductor element manufacturing method includes: a fluorocarbon layer forming process in which a fluorocarbon (CFx: x is a random number) layer is formed on the to-be-processed substrate, a resist layer forming process in which a resist layer is formed on the fluorocarbon layer; a patterning process in which the resist layer is patterned into a predetermined shape, a fluorocarbon layer etching process in which the fluorocarbon layer is etched using the resist layer patterned into a predetermined shape as a mask to pattern the fluorocarbon layer, and a to-be-processed substrate etching process in which the to-be-processed substrate is etched using the patterned fluorocarbon layer as a mask.

A semiconductor element manufacturing method according to still yet another aspect of the present invention is a semiconductor element manufacturing method in which a to-be-processed substrate is etched to manufacture a semiconductor element. The semiconductor element manufacturing method includes: a hard mask layer forming process in which a hard mask layer is formed on the to-be-processed substrate, a fluorocarbon layer forming process in which a fluorocarbon (CFx: x is a random number) layer which is patterned into a predetermined shape is formed on the hard mask layer after the hard mask layer forming process; a silicon containing film forming process in which a silicon containing film is formed to cover the formed fluorocarbon layer and the hard mask layer exposed between the fluorocarbon layers after the fluorocarbon layer forming process, a silicon containing film etching process (etch back process) in which etching is performed to remove the silicon containing film located on the top side of the hard mask layer and on the top side of the fluorocarbon layer while leaving the silicon containing film located on a side wall side of the fluorocarbon layer after the silicon containing film forming process; a fluorocarbon layer etching process in which an etching is performed to remove the fluorocarbon layer located between the side walls after the silicon containing film etching process; a hard mask layer etching process in which the hard mask is etched using the remained silicon containing film as a mask, after fluorocarbon layer etching process, and a to-be-processed substrate etching process in which the to-be-processed substrate is etched using the remained hard mask as a mask, after the hard mask etching process.

A semiconductor element according to still yet another aspect of the present invention is manufactured in such a manner that a fluorocarbon (CFx: x is a random number) layer is formed on the to-be-processed substrate, a resist layer is formed on the fluorocarbon layer, the resist layer is patterned into a predetermined shape, the fluorocarbon layer is etched and patterned using the resist layer patterned into a predetermined shape as a mask, and the to-be-processed substrate is etched using the patterned fluorocarbon layer as a mask.

A semiconductor element according to still yet another aspect of the present invention is manufactured in such a manner that a hard mask layer is formed on a to-be-processed substrate, a fluorocarbon (CFx: x is a random number) layer patterned into a predetermined shape is formed on the hard mask layer, a silicon containing film is formed to cover the formed fluorocarbon layer and the hard mask layer exposed between the fluorocarbon layers, an etching is performed to remove the silicon containing film located on the top side of the hard mask layer and on the top side of the fluorocarbon layer while leaving the silicon containing film located on a side wall side of the fluorocarbon layer, an etching is performed to remove the fluorocarbon layer located between the side walls; the hard mask is etched using the remained silicon containing film as a mask, and the to-be-processed substrate is etched using the remained hard mask as a mask.

Further, an etching method according to still yet another aspect of the present invention is an etching method in which a to-be-processed substrate is etched using a mask patterned on the to-be-processed substrate, and the mask has an absorption rate of 90% or more with respect to a wavelength of about 193 nm.

Effect of the Invention

According to the etching method and the substrate processing method, the functions as an antireflective film and a hard mask are provided by only a single layer of the fluorocarbon layer. By doing this, since forming of only the fluorocarbon layer is needed during the mask forming process, the reduction of the number of processes and the improvement of the reproducibility may be achieved. Accordingly, according to the etching method and the processing method, the reliability of processing may be improved and the costs may be kept low.

Further, a pattern forming method according to the present invention may improve the reliability of the processing and keep the manufacturing costs low.

Still further, a semiconductor element manufacturing method according to the present invention may improve the reliability of the processing and keep the manufacturing costs low.

Furthermore, a semiconductor element according to the present invention may be fabricated highly reliably and inexpensively.

DETAILED DESCRIPTION

Figure 1:
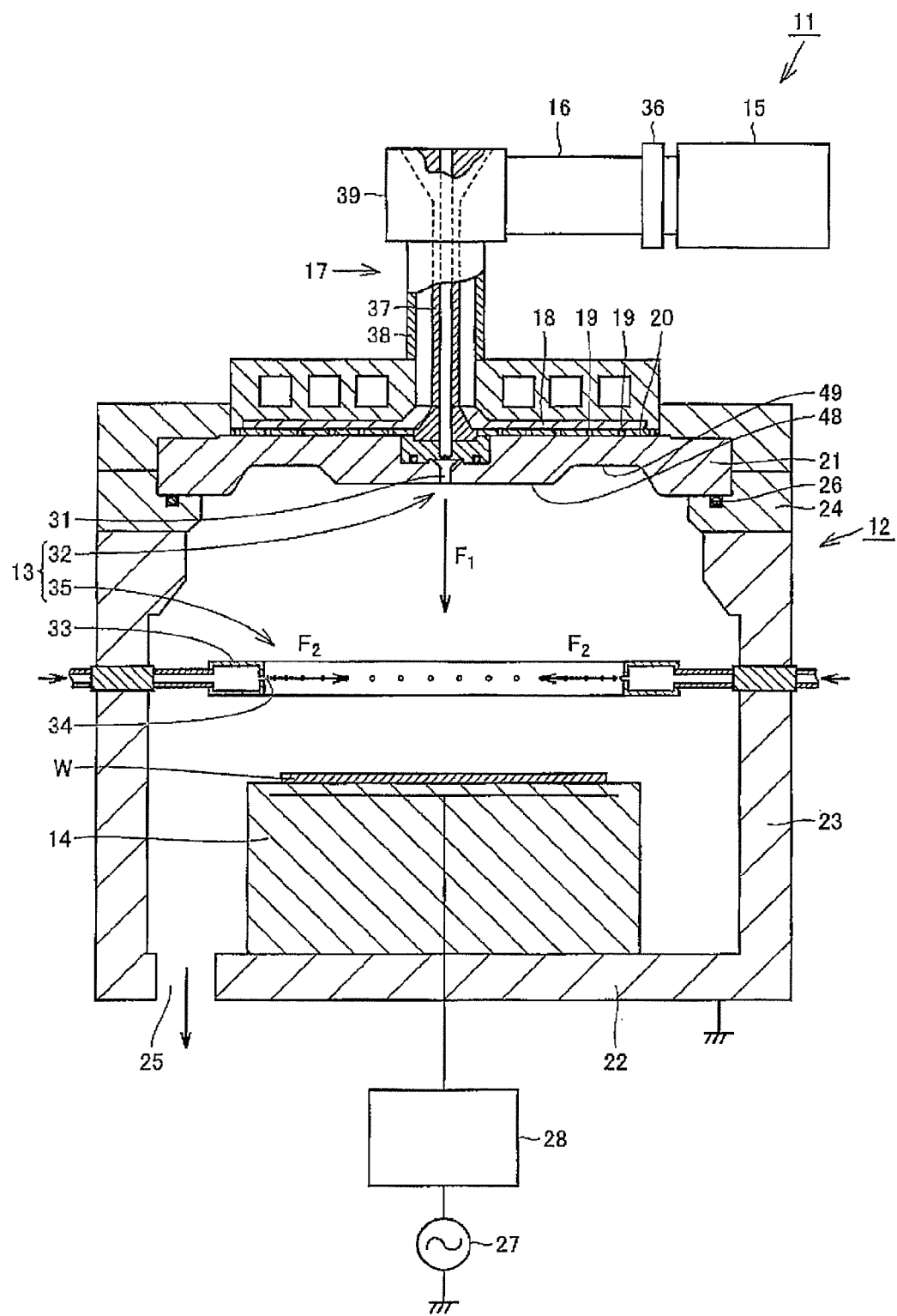
FIG. 1 is a schematic cross-sectional view illustrating main parts of a plasma processing apparatus used in an etching method and a substrate processing method according to an embodiment of the present invention.
Figure 2:
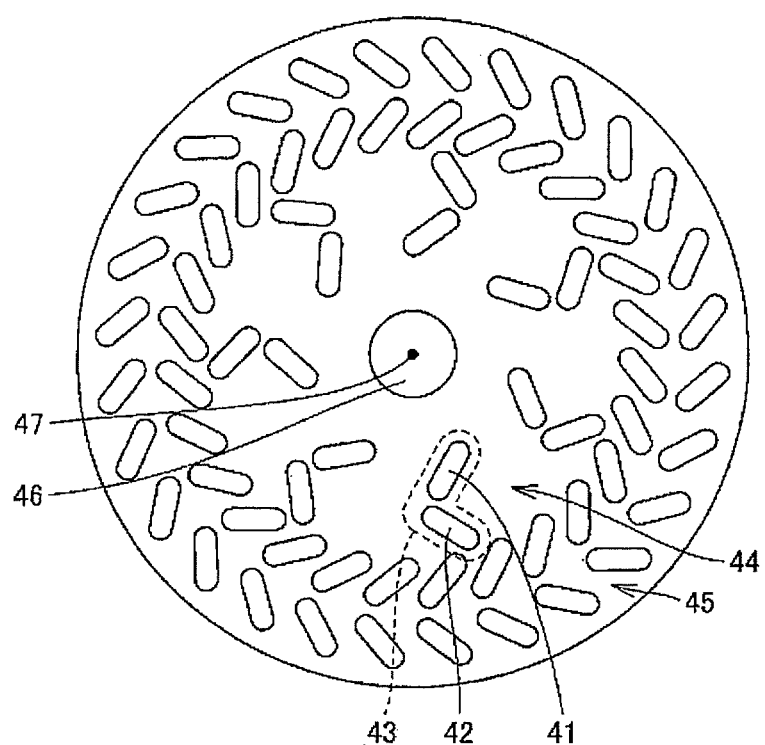
FIG. 2 is a view illustrating a slot antenna plate incorporated in the plasma processing apparatus illustrated when viewed from a thickness direction thereof.

Hereinafter, embodiments of the present invention will be described with reference to accompanying drawings. First, a configuration and operations of a plasma processing apparatus used in an etching method and a substrate processing method according to an embodiment of the present invention. FIG. 1 is a schematic cross-sectional view schematically illustrating a configuration of a plasma processing apparatus used in an etching method and a substrate processing method according to the embodiment of the present invention. FIG. 2 is a view illustrating a slot antenna plate provided in the plasma processing apparatus illustrated in FIG. 2 when viewed from a thickness direction thereof.

Referring to FIG. 1 and FIG. 2, a plasma processing apparatus 11 is a microwave plasma processing apparatus which uses microwave as a plasma source. Plasma processing apparatus 11 may perform a plasma etching process and a plasma CVD process. Plasma processing apparatus 11 is provided with a processing container 12 having a processing space within which a plasma processing is performed on a to-be-processed substrate W, a gas supply unit 13 that supplies a plasma processing gas into the processing container, a support 14 that is installed within processing container 12 and supports a to-be-processed substrate W thereon, a microwave generator 15 that is installed in the outside of processing container 12 and generates microwave for exciting plasma, a waveguide 16 and a coaxial waveguide 17 that introduce microwave generated by microwave generator 15 into processing container 12, a dielectric plate 18 that is connected to a lower end portion of coaxial waveguide 17 and propagates the microwave introduced by coaxial waveguide 17 in a diametrical direction, a slot antenna plate 20 that is disposed on the bottom side of dielectric plate 18 and has plural slots (long holes) 19 that radiate microwave propagated by dielectric plate 18, a dielectric window 21 that is disposed on the bottom side of the slot antenna plate 20 and propagates the microwave radiated from the slot 19 to be transmitted into processing container 12, and a control unit (not illustrated) that controls the entirety of plasma processing apparatus 11. The control unit controls process conditions, such as a gas flow rate in gas supply unit 13 and a pressure within processing container 12, for performing plasma processing on the to-be-processed substrate W. In addition, FIG. 1 schematically illustrates an opening shape of slot 19 from the viewpoint of easy understanding.

The processing container 12 includes a bottom portion 22 located below support 14, a side wall 23 extending upwardly from an outer periphery of bottom portion 22, and an annular member 24 that is disposed to be mounted on the top side of side wall 23 and may be provided with dielectric window 21. Side wall 23 has a cylindrical shape. An exhaust hole 25 for exhausting is formed in bottom portion 22 of processing container 12. The top side of processing container 12 is open, and processing container 12 is configured to be sealable by dielectric window 21 disposed on an upper side of processing container 12 and an O ring 26, as a seal member, interposed between dielectric window 21 and processing container 12, specifically annular member 24 constituting processing container 12.

In support 14, a high frequency power supply 27 for a radio frequency (RF) bias is electrically connected to an electrode within support 14 via a matching unit 28. High frequency power supply 27 outputs a predetermined frequency, for example, a high frequency of 13.56 MHz at a predetermined power suitable to control the energy of ion implanted into to-be-processed substrate W. Matching unit 28 accommodates a matcher for matching of impedance on high frequency power supply 27 side and impedance on a load side, such as, mainly an electrode, plasma, and processing container 12, and a blocking condenser for generating self-bias is included in the matcher. Further, although not illustrated, support 14 may include a support mechanism that supports the to-be-processed substrate W or a temperature control mechanism that controls temperature.

Gas supply unit 13 includes: a central gas supply unit 32 having a gas supply port 31 that supplies gas towards a center of the to-be-processed substrate W, and an outer gas supply unit 35 configured by a hollow member 33 with an annular cross-section and having a gas supply port 34 that supplies gas towards an inner side in a diametrical direction.

Central gas supply unit 32 and outer gas supply unit 35 supply a plasma processing gas into processing container 12 from outside of processing container 12, respectively. Each flow direction of the gas supplied from gas supply ports 31 and 34 is denoted by arrows $F_1$ and $F_2$ in FIG. 1. A flow rate of the gas supplied from central gas supply unit 32 and the outer gas supply unit 35 can be arbitrarily selected. For example, it is possible to supply the gas only from the outer gas supply unit 35 by not allowing the gas to be supplied from the central gas supply unit 32.

A microwave generator 15 having the microwave matcher 36 is connected to the upstream side of waveguide 16 which introduces microwave through a mode converter 39 and coaxial waveguide 17 constituted by a central conductor 37 and an outer peripheral conductor 38. Both of central conductor 37 and outer peripheral conductor 38 of waveguide 17 have a cylinder shape and are disposed to extend in an up and down direction in FIG. 1 in such a manner that centers of the diametrical directions of central conductor 37 and outer peripheral conductor 38 coincide with each other and a gap is formed between the outer peripheral surface of central conductor 37 and the inner peripheral surface of outer peripheral conductor 38. For example, the microwave, which is in a TE mode, generated by microwave generator 15 passes through waveguide 16. Then, the microwave is converted into a TE mode by a mode converter 39, and is propagated through coaxial waveguide 17. A frequency of, for example, 2.45 GHz is selected as the frequency of the microwave generated by microwave generator 15.

Slot antenna plate 20 has a thin disk shape. Each of the opposite sides of slot antenna plate 20 in the plate thickness direction thereof is flat. Slot antenna plate 20 is formed with a plurality of slots 19 that penetrate slot antenna plate 20 in the plate thickness direction. Slots 19 are formed such that a first slot 41 elongated in one direction and a second slot 42 elongated in another direction orthogonal to first slot 41 are adjacent to each other and form a pair. Specifically, slots 19 are configured such that two adjacent slots 41 and 42 form a pair and are disposed to be orthogonal to each other with a gap. That is, slot antenna plate 20 is configured to have a slot pair 43 configured by first slot 41 extending in one direction and second slot 42 extending in another direction orthogonal to the one direction. In addition, an example of slot pair 43 is illustrated in an area represented by a dotted line in FIG. 2.

Slot pairs 43 are largely classified into an inner peripheral side slot pair group 44 disposed in an inner peripheral side and an outer peripheral side slot pair group 45 disposed in an outer peripheral side. In inner peripheral side slot pair group 44, each of seven slot pairs 43 is disposed at regular intervals in the circumferential direction. In outer peripheral side slot pair group 45, twenty eight slot pairs 43 is disposed at regular intervals in the circumferential direction. Also, a through hole 46 is formed at the center of the diametrical direction of slot antenna plate 20. Slot antenna plate 20 has a rotational symmetry about the center 47 of the diametrical direction.

Dielectric window 21 is formed in a substantially disk shape and has a predetermined plate thickness. Dielectric window 21 is made of a dielectric material and specific materials of dielectric window 21 may be, for example, quartz or alumina. Dielectric window 21 is provided in such a manner that the bottom side thereof in FIG. 1 is placed on an annular member 24 and hermetically attached to plasma processing apparatus 11. In dielectric window 21, a dielectric window concavity 49, which is continued in an annular shape and is concaved in a taper shape towards the inner side in the plate thickness direction, which corresponds to the upward direction in FIG. 1, is formed in the diametrically outer region of a bottom surface 48 that serves as a plasma generating side when dielectric window 21 is provided in plasma processing apparatus 11. As the region which continuously changes the thickness of dielectric window 21 is formed in the diametrically outer region of dielectric window 21 by dielectric window concavity 49, a resonance region may be formed that has a thickness equivalent to that of dielectric window 21 which is appropriate for various process conditions for generating plasma. As such, a high stability of plasma in a lower region of dielectric window 21 may be secured according to various process conditions.

The microwave generated by microwave generator 15 is propagated to dielectric plate 18 through coaxial waveguide 17, and radiated to dielectric window 21 from plurality of slots 19 formed in slot antenna plate 20. After transmitting dielectric window 21, the microwave causes an electric field to be generated directly below dielectric window 21 so that plasma is generated within processing container 12. The plasma generated directly below dielectric window 21 is diffused away from dielectric window 21, that is, towards support 14. A plasma processing such as a plasma etching is performed in a diffusion region enclosing the to-be-processed substrate W disposed on support 14. In plasma processing apparatus 11, microwave plasma provided for the processing is generated by a radial line slot antenna which includes slot antenna plate 20 and dielectric window 21 configured as described above. With plasma processing apparatus 11, the plasma processing may be performed at a relatively low electron temperature and with a relatively high electron density. Therefore, plasma damage in relation to the to-be-processed substrate W may be suppressed during the processing, and the processing may be performed at high speed.

In order to perform a fine etching of 45 nm or less for a to-be-processed substrate such as a silicon substrate, a method is proposed in which three layers of a hard mask layer, an organic film layer (optical distribution layer), an anti reflective coat (ARC) layer are formed and then the etching is performed. The method for etching the to-be-processed substrate after forming the three layers will be briefly described.

Figure 3:
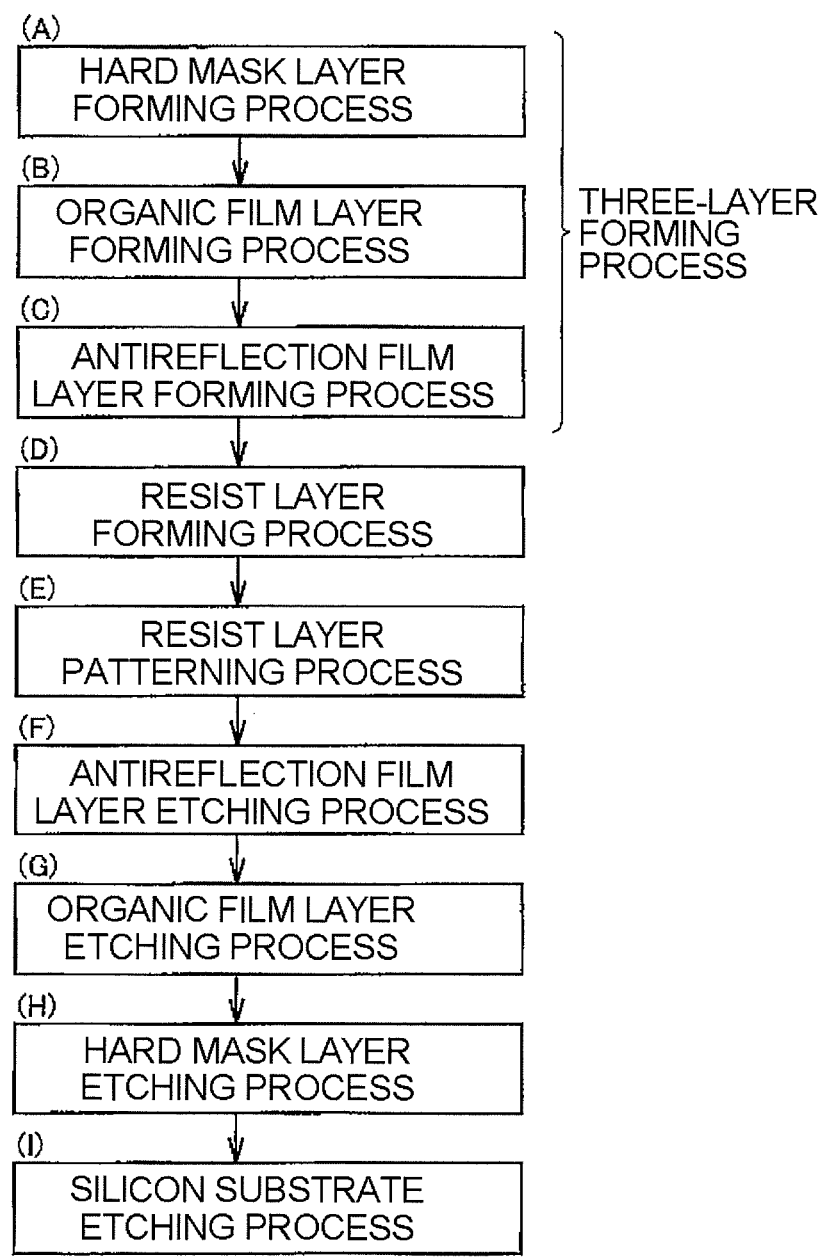
FIG. 3 is a flowchart illustrating a representative process of a substrate processing method in which three layers are formed to etch a to-be-processed substrate.
Figure 4:
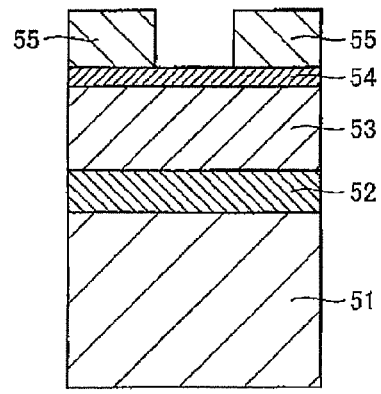
FIG. 4 is a schematic cross-sectional view of a silicon substrate on which the three layers are formed.

FIG. 3 is a flowchart illustrating a representative process of a substrate processing method for such a case. FIG. 4 is a schematic cross-sectional view of a silicon substrate on which the three layers are formed. Referring to FIGS. 3 and 4, first, a hard mask layer 52 is formed on a silicon substrate 51 as the to-be-processed substrate [FIG. 3A]. Hard mask layer 52 is configured by, for example, a SiN film. Subsequently, an organic film layer 53 is formed on hard mask layer 52 relatively thickly. Specifically, organic film layer 53 having a thickness of about 200 nm is formed, which may be varied in dependence on the material, in order to secure a sufficient antireflective capability [FIG. 3B]. Subsequently, an anti reflective coat (ARC) layer 54 having a thickness of about dozens of nm is formed on organic film layer 53 [FIG. 3C]. Anti reflective coat layer 54 is configured by, for example, a silicon (Si) containing film, specifically, a film called a Si-ARC. The thickness of anti reflective coat layer 54, which may be varied independence on the material, is about 40 nm. The process as described above is a three-layer mask forming process. Further, the organic film layer 53 and anti reflective coat layer 54 serve as a film which suppresses reflection of exposure light when patterning a photoresist. A relatively thick film having a thickness in the order of the thickness as described above is needed to prevent reflection.

Subsequently, a resist layer 55 is formed on anti reflective coat layer 54 [FIG. 3D]. Then, an exposing and a developing are performed using a light source (not illustrated) to pattern resist layer 55 [FIG. 3E]. FIG. 4 illustrates resist layer 55 in the patterned state.

Figure 5:
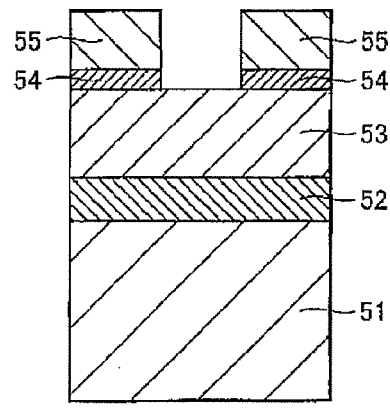
FIG. 5 is a schematic cross-sectional view illustrating a state where an etching of an anti reflective coat layer is ended.
Figure 6:
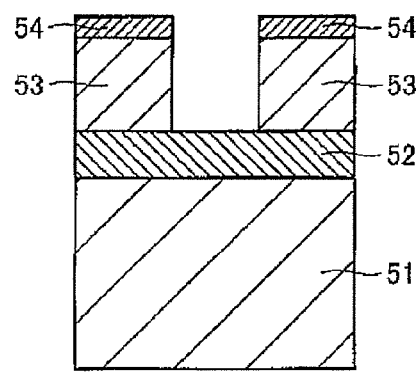
FIG. 6 is a schematic cross-sectional view illustrating a state where an etching of an organic film layer is ended.

Then, anti reflective coat layer 54 is etched using patterned resist layer 55 as a mask [FIG. 3F]. FIG. 5 is a schematic cross-sectional view illustrating a state where the etching of anti reflective coat layer 54 is ended. After the etching of anti reflective coat layer 54 is ended, organic film layer 53 is etched [FIG. 3G]. Resist layer 55 is also etched and removed when etching organic film layer 53. FIG. 6 is a schematic cross-sectional view illustrating a state where the etching of organic film layer 53 is ended.

Figure 7:
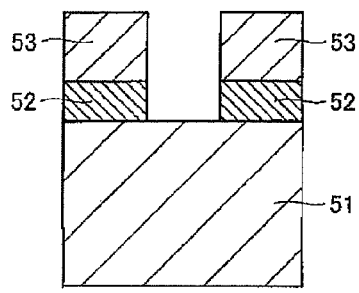
FIG. 7 is a schematic cross-sectional view illustrating a state where an etching of a hard mask layer is ended.
Figure 8:
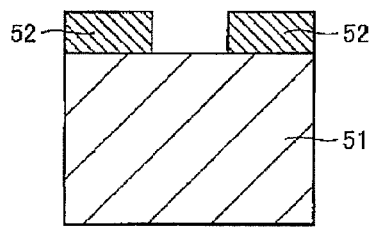
FIG. 8 is a schematic cross-sectional view illustrating a state where the organic film layer is removed.

Then, hard mask layer 52 is etched using remaining organic film layer 53 as a mask [FIG. 3H]. FIG. 7 is a schematic cross-sectional view illustrating a state where the etching of hard mask layer 52 is ended. Subsequently, organic film layer 53 is removed and silicon substrate 51 is etched using remaining hard mask layer 52 as a mask. By doing this, silicon substrate 51 is etched. FIG. 8 is a schematic cross-sectional view illustrating a state where the etching of organic film layer 53 is ended.

Figure 9:
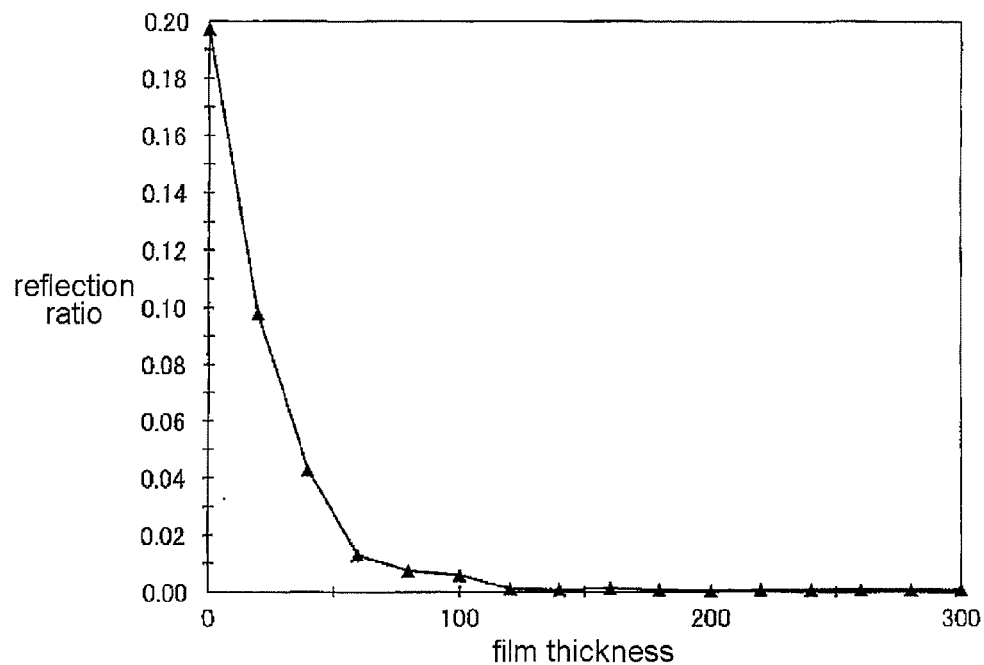
FIG. 9 is a graph illustrating a relationship between a film thickness and a reflection rate of the organic film layer.

The etching method using the three-layer mask is disadvantageous in the following features. First, as described above, it is required to form the organic film layer relatively thickly. FIG. 9 is a graph illustrating a relationship between a film thickness of the organic film when a Si-ARC having a thickness of 30 nm is laminated on the organic film layer and a reflection rate of light when light having a wavelength of 193 nm is irradiated on the organic film. The axis of ordinates indicates the reflection rate of light and the axis of abscissas indicates the film thickness (nm) of the organic film.

Referring to FIG. 9, up to about 100 nm of the organic film layer, the reflection rate of light increases as the organic film layer becomes thinner. Accordingly, it is required that the thickness of the organic film layer be 100 nm or more in order to sufficiently reduce the reflection of light during exposure. Forming of such a thick film is also disadvantageous in terms of an improvement of throughput. That is, it is difficult to achieve an improvement of throughput due to the film thickness merely by thinning the organic film layer.

Further, although each of the formed three layers needs to be etched, it is also required that each layer has selectivity in etching. Further, forming of layer using such different materials leads to the deterioration of reproducibility, which in turn causes the increase of the number of processes. Furthermore, it may be conceived that it is difficult to etch such different layers using the same plasma processing apparatus, and leads inevitably to the increase of the number of the plasma processing apparatuses, which in turn leads to the increase of the manufacturing costs.

Figure 10:
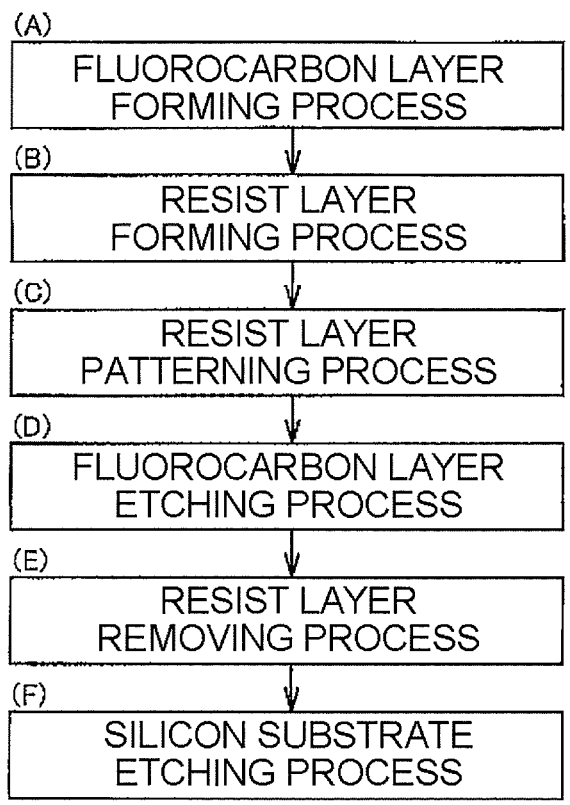
FIG. 10 is a flowchart illustrating a representative processing process when the fluorocarbon layer is formed and the to-be-processed substrate W is etched.
Figure 11:
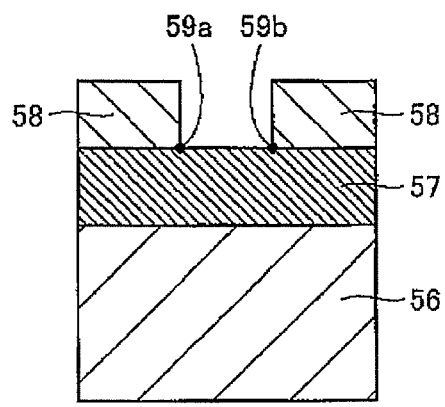
FIG. 11 is a schematic cross-sectional view illustrating the silicon substrate on which the fluorocarbon layer and the like are formed.

Accordingly, a method in which a fluorocarbon layer is formed and etched using the plasma processing apparatus 11 will be described. FIG. 10 is a flowchart illustrating a process of a representative processing when the fluorocarbon layer is formed and the to-be-processed substrate W is etched using the plasma processing apparatus 11 illustrated in FIG. 1. FIG. 11 is a schematic cross-sectional view of a silicon substrate in which a fluorocarbon layer and the like are formed.

Referring to FIGS. 10 and 11, first, a fluorocarbon layer 57 is formed on a silicon substrate 56 which corresponds to a to-be-processed substrate [FIG. 10A]. In this case, fluorocarbon layer 57 is formed on silicon substrate 56 by a plasma CVD process using plasma processing apparatus 11. In this case, a noble gas, for example, Ar gas, for exciting plasma is used and a fluorocarbon gas, for example, $C_5F_8$ gas is used as a deposition gas for forming the fluorocarbon layer. That is, a mixed gas containing such gases is supplied from gas supply unit 13 provided in plasma processing apparatus 11 to perform the plasma CVD processing.

Subsequently, a resist layer 58 is formed on fluorocarbon layer 57 by a coating and developing device [FIG. 10B]. Thereafter, an exposing and developing is performed on resist layer 58 to be patterned into a predetermined shape [FIG. 10C]. In this case, it may be performed by a liquid immersion exposure. In this case, fluorocarbon layer 57 located below resist later 58 has a function as an antireflective coat layer. FIG. 11 illustrates the resist layer in the patterned state.

Subsequently, fluorocarbon layer 57 is etched using resist layer 58 patterned into a predetermined shape as a mask [FIG. 10D]. An example of etching conditions will be described. An etching is performed under a condition where a microwave power is set to 2500 W, a bias power (300 mm wafer, 0.21 W/cm$^2$ per unit area) is set to 150 W, a gas volume of Ar gas, HBr gas and O$_2$ gas as etching gas is set to Ar/HBr/O$_2$=1000 sccm/500 sccm/20 sccm, a pressure within a processing container is set to 20 mTorr (2.66 Pa), and a temperature of the support of the to-be-processed substrate is set to 20° C. The etching may be performed by adjusting the condition even if the Cl$_2$, or CHF$_3$, CH$_2$F$_2$, or CH$_3$F is used, instead of HBr, as the etching gas.

Figure 12:
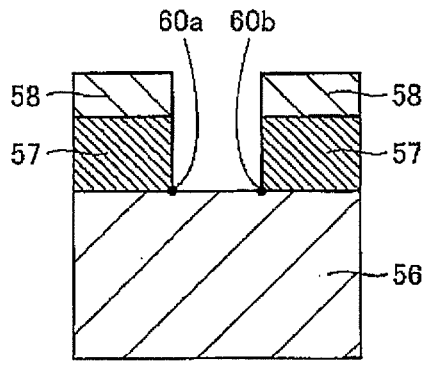
FIG. 12 is a schematic cross-sectional view illustrating a state where an etching of the fluorocarbon layer is ended.
Figure 13:
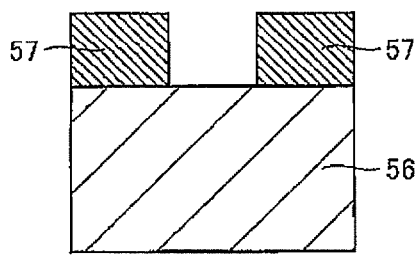
FIG. 13 is a schematic cross-sectional view illustrating a state where a resist layer is removed.

FIG. 12 is a schematic cross-sectional view in a state where the etching of fluorocarbon layer 57 is ended. Resist layer 58 as a mask is removed [FIG. 10E]. FIG. 13 is a schematic cross-sectional view in a state where resist layer 58 is removed. Then, the silicon substrate is etched using remaining fluorocarbon layer 57 as a mask [FIG. 10F]. In this case, fluorocarbon layer 57 functions as a hard mask layer. By doing this, the silicon substrate is etched.

That is, the substrate processing method according to an embodiment of the present invention includes: a fluorocarbon layer forming process in which a fluorocarbon (CFx: x is a random number) layer is formed on the to-be-processed substrate; a resist layer forming process in which a resist layer is formed on the fluorocarbon layer, a patterning process in which the resist layer is patterned into a predetermined shape, a fluorocarbon layer etching process in which the fluorocarbon layer is etched using the patterned resist layer as a mask to etch the fluorocarbon layer, and a to-be-processed substrate etching process in which the to-be-processed substrate is etched using the etched fluorocarbon layer as a mask.

Further, in an etching method according to an embodiment of the present invention, the to-be-processed substrate is etched using the fluorocarbon layer patterned into a predetermined shape on the to-be-processed substrate as a mask.

According to the etching method and a substrate processing method, the fluorocarbon layer by itself functions as an antireflective film and a hard mask. By doing this, since forming of only the fluorocarbon layer is needed during the mask forming process, the reduction of the number of processes and the improvement in the reproducibility may be achieved. Accordingly, according to the etching method and the substrate processing method, the reliability of processing may be improved and the costs may be reduced.

A pattern forming method according to an embodiment of the present invention is a pattern forming method which forms a pattern at the time when a to-be-processed substrate is etched. The pattern forming method includes: a fluorocarbon layer forming process in which a fluorocarbon (CFx: x is a random number) layer is formed on the to-be-processed substrate, a resist layer forming process in which a resist layer is formed on the fluorocarbon layer; a patterning process in which the resist layer is patterned into a predetermined shape, and a pattern forming process in which the fluorocarbon layer is etched using the patterned resist layer as a mask to etch the fluorocarbon layer to form a pattern of the fluorocarbon layer at the time when the to-be-processed substrate is etched.

According to the pattern forming method, the reliability of processing may be improved while reducing the costs.

Further, a semiconductor element manufacturing method according to an embodiment of the present invention is a semiconductor element manufacturing method in which a to-be-processed substrate is etched to manufacture a semiconductor element. The semiconductor element manufacturing method includes: a fluorocarbon layer forming process in which a fluorocarbon (CFx: x is a random number) layer is formed on the to-be-processed substrate, a resist layer forming process in which a resist layer is formed on the fluorocarbon layer; a patterning process in which the resist layer is patterned into a predetermined shape, a fluorocarbon layer etching process in which the fluorocarbon layer is etched using the patterned resist layer as a mask, and a to-be-processed substrate etching process in which the to-be-processed substrate is etched using the etched fluorocarbon layer as a mask.

According to the semiconductor element manufacturing method, the reliability of processing may be improved while reducing the manufacturing costs.

Further, a semiconductor element according to an embodiment of the present invention is manufactured by forming a fluorocarbon (CFx: x is a random number) layer on a to-be-processed substrate, forming a resist layer on the fluorocarbon layer; patterning the resist layer into a predetermined shape, etching the fluorocarbon layer using the resist layer patterned into the predetermined shape as a mask, and etching the to-be-processed substrate using the etched fluorocarbon layer as a mask.

Such a semiconductor element may be manufactured highly reliably and inexpensively.

Here, a brief description of a function of the fluorocarbon layer as a hard mask is made as follows. That is, the fluorocarbon layer is a dense film which is relatively harder than the Si-ARC film or the organic film. Therefore, it has a sufficient function as the hard mask. Further, when using such a relatively hard fluorocarbon layer, it is possible to achieve an improvement of selection ratio in etching.

Further, the fluorocarbon layer has a good thermal resistance. Therefore, it is possible to reduce an influence by, such as thermal shrinkage, so that etching may be performed with a high precision.

Figure 14:
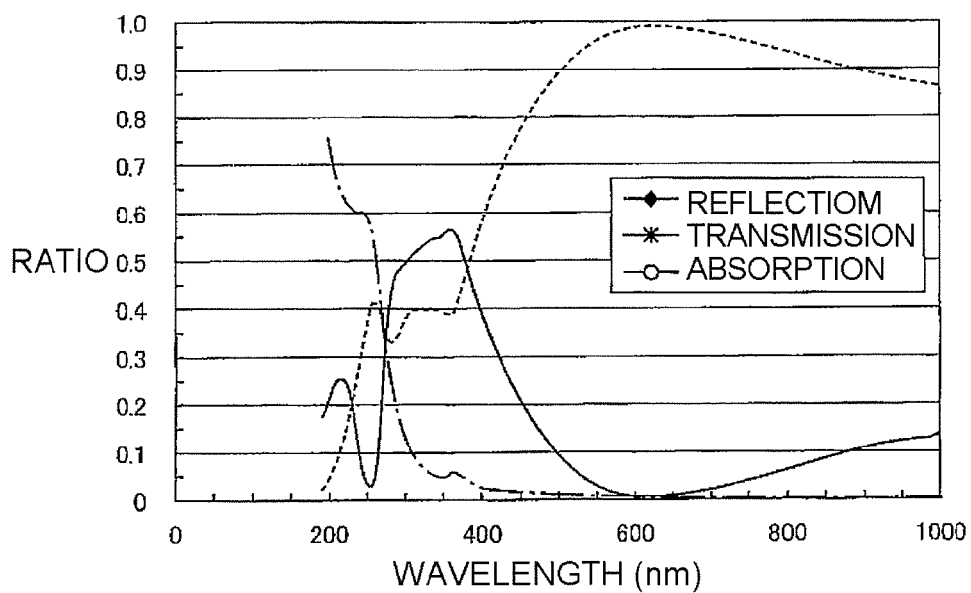
FIG. 14 is a graph illustrating a relationship between a wavelength of light and ratios of a reflection rate, an absorption rate and transmission rate of light in the fluorocarbon layer.
Figure 15:
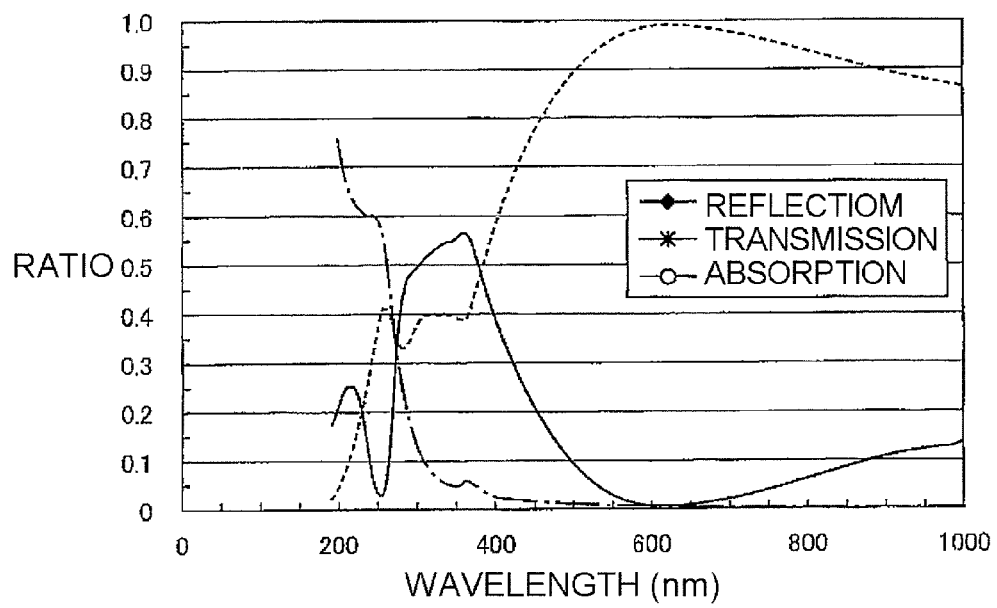
FIG. 15 is a graph illustrating a relationship between a wavelength of light and ratios of a reflection rate, an absorption rate and transmission rate of light in the SiCN film.

A brief description of a function of the fluorocarbon layer as an antireflective coat layer is made as follows. FIG. 14 is a graph illustrating a relationship between a wavelength of light and ratios of a reflection rate, an absorption rate and a transmission rate of light in the fluorocarbon layer. Further, a case of SiCN film is also illustrated for reference. FIG. 15 is a graph illustrating a relationship between a wavelength of light and ratios of a reflection rate, an absorption rate and a transmission rate of light in the SiCN film.

Figure 16:
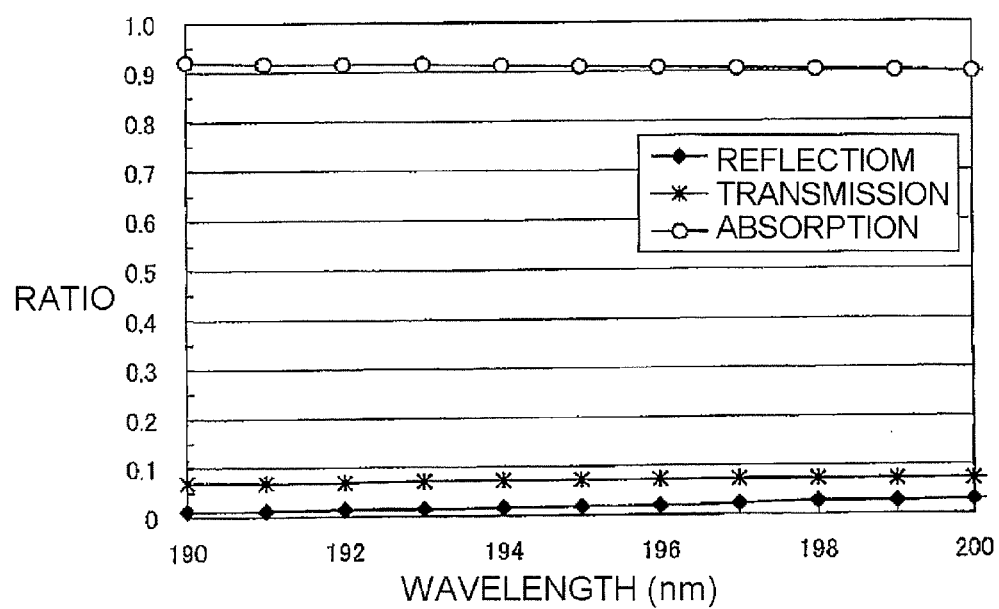
FIG. 16 is a graph illustrating a relationship between a wavelength of light and a reflection rate and the like in the fluorocarbon layer at a wavelength of light of about 193 nm.
Figure 17:
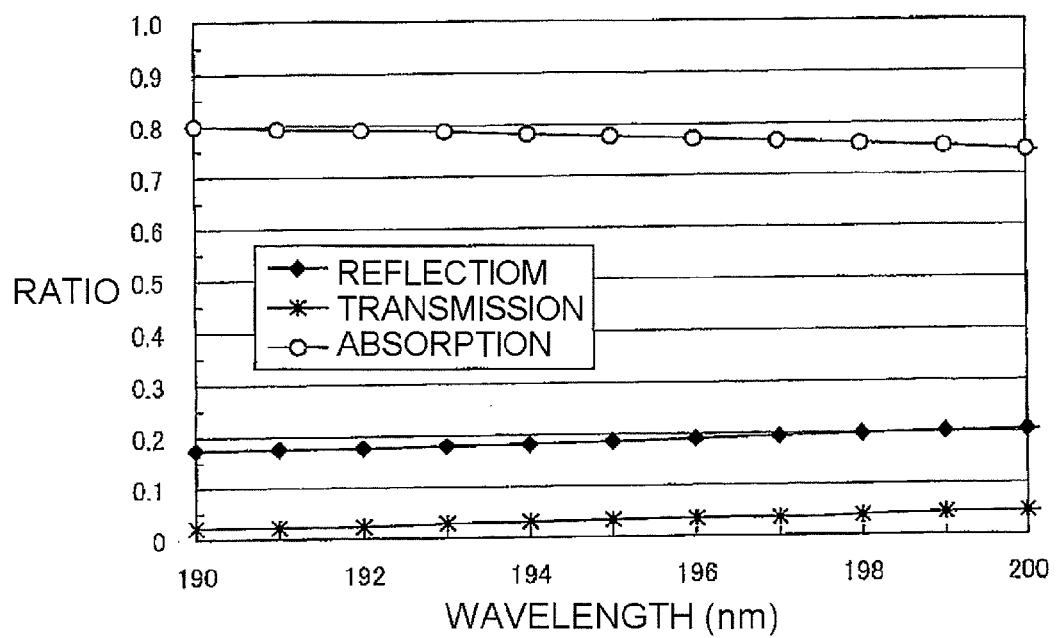
FIG. 17 is a graph illustrating a relationship between a wavelength of light and a reflection rate and the like in the SiCN film at a wavelength of light of about 193 nm.

FIG. 16 is a graph illustrating a relationship between a wavelength of light and a reflection rate and the like in the fluorocarbon layer having a wavelength of light (ArF) of about 193 nm. FIG. 17 is a graph illustrating a relationship between a wavelength of light and a reflection rate and the like in the SiCN film having a wavelength of light (ArF) of about 193 nm. In FIG. 14 to FIG. 17, the axis of ordinates indicates a reflection rate, an absorption rate, and transmission rate of light, and the axis of abscissas indicates a wavelength (nm) of light.

Referring to FIG. 14 to FIG. 17, in a case of the fluorocarbon layer, a reflection rate at about 193 nm is very low, and has a value close to zero. Further, it can be seen that the absorption rate at 193 nm exceeds 0.9, i.e., 90%, and thus absorbs light with little reflection. That is, it can be found that the fluorocarbon layer has an antireflection effect. An etching method according to an embodiment of the present invention is an etching method in which a to-be-processed substrate is etched using a patterned mask on the to-be-processed substrate, and the mask has an absorption rate of 90% or more for the wavelength of about 193 nm. In a case of a SiCN film, the reflection rate near 193 nm is slightly lower than 0.2. Further, the absorption rate near the 193 nm is about 0.8.

Further, regarding the reflection rate, a reflection rate at a wavelength of about 193 nm is important, but in a case of the fluorocarbon layer, the reflection rate and the like at wavelengths of, such as, 192 nm or 194 nm are almost equivalent to those at 193 nm.

Specifically, regarding the improvement of the reliability, an etching that improves a line width roughness (LWR) may be performed in a fine etching process. When describing the LWR with referring to FIGS. 11 to 13 again, in patterning of resist layer 58, it is ideal that a portion represented by points 59a and 59b is formed as a boundary line that straightly extends in the front and rear direction of the surface of the drawing, and a gap in the boundary line represented by points 59a and 59b becomes a predetermined width in the front and rear direction of the surface of the drawing. It is ideal that a boundary line formed at a portion represented by points 60a and 60b formed by etching based on the above-mentioned boundary line straightly extends in the front and rear direction of the surface of the drawing and a gap thereof becomes a predetermined width in the front and rear direction of the surface of the drawing. However, as the etching times increases or a film to be etched becomes thick, the boundary line becomes curved or widths at respective positions in the front and rear direction of the surface of the drawing are very different from each other. Therefore, the LWR characteristic is deteriorated. However, according to the method of etching after forming the fluorocarbon layer as described above, the LWR after etching becomes good in a viewpoint that the thickness thereof may be reduced, in addition to the fact that only a single layer may be formed.

Further, the substrate processing method for forming such a fluorocarbon layer may be applied to an ordinary exposure, but is advantageously applied to a liquid immersion exposure. A brief description of such a liquid immersion exposure is made as follows. For example, ultra pure deionized water is interposed between resist layer 58 before a patterning is performed and a light source for exposing (not illustrated) installed at a position located near resist layer 58 as an upper side of resist layer 58. Then, the resist layer is patterned by performing an exposing using the light source. When such a liquid immersion exposure is performed, a finer resist pattern may be formed as compared to a case where an ordinary exposure is performed. In this case, since the fluorocarbon layer has a hydrophobic property, it is various advantageous when performing the liquid immersion exposure. That is, when ultra pure deionized water is interposed during the liquid immersion exposure there is little concern that the shape of the mask is deformed due to the infiltration of the ultra pure deionized water into the film, and a good pattern may be formed.

Further, in addition to the fluorocarbon layer described above, the SiCN film may be formed in the upper and lower layers of the fluorocarbon layer, thereby forming the fluorocarbon layer and the SiCN film in a lamination structure. Further, the SiCO film and an amorphous carbon (α-C) film that represent the same reflection rate as the SiCN film may be formed in the upper and lower layers of the SiCN film, thereby forming a lamination structure. Specifically, a process to form at least one of the SiCN layer, SiCO layer and the amorphous carbon layer between the fluorocarbon layer and the resist layer may be included, and a process to form at least one of the SiCN layer, SiCO layer and the amorphous carbon layer between the fluorocarbon layer and the to-be-processed substrate may be included. That is, at least one of the SiCN layer, SiCO layer and the amorphous carbon layer may be interposed between the fluorocarbon layer and the to-be-processed substrate, and at least one of the SiCN layer, SiCO layer and the amorphous carbon layer may be formed above the fluorocarbon layer. Of course, such a film may be formed in the upper and lower layers of the fluorocarbon layer, thereby forming a lamination structure. Such a SiCN film, SiCO film, and amorphous carbon film may be used as, for example, a stopper film, during an etching. A surface processing, for example, a chemical liquid processing or a plasma processing, may be performed for the SiCN film, SiCO film, and amorphous carbon film before the films are formed in order to improve the adhesion of the films. The SiCN film, SiCO film, and amorphous carbon film may be processed by $N_2$ plasma or a chemical liquid in order to improve the adhesion between the surface of the hydrophobic fluorocarbon layer surface and a resist to be formed.

Figure 18:
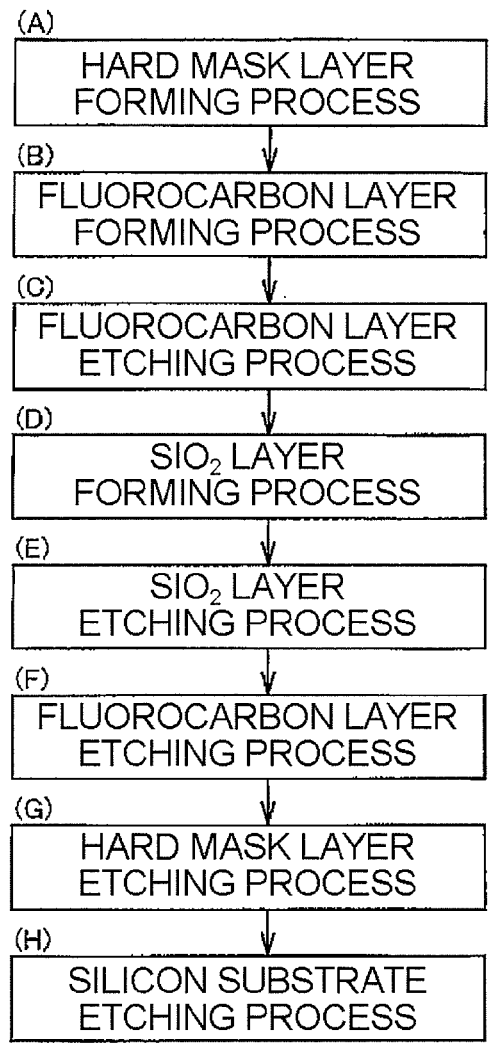
FIG. 18 is a flowchart illustrating a process of representative processing when the fluorocarbon layer is formed and the to-be-processed substrate W is etched.
Figure 19:
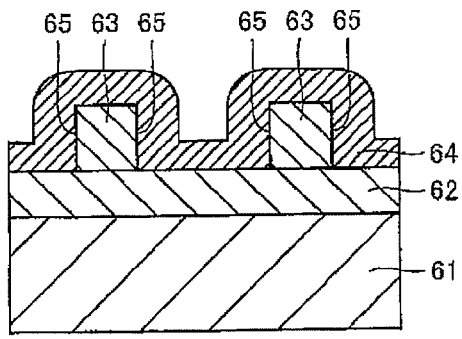
FIG. 19 is a schematic cross-sectional view illustrating the silicon substrate on which the fluorocarbon layer is formed.

Subsequently, a case where such a film, i.e., the fluorocarbon layer, is applied to a double patterning of a core material will be described. FIG. 18 is a flowchart illustrating a flow of processes in such a case. FIG. 19 is a schematic cross-sectional view of the silicon substrate in which the fluorocarbon layer and the like are formed.

Referring to FIGS. 18 and 19, first, a hard mask layer 62 is formed on a silicon substrate layer 61 which corresponds to a to-be-processed substrate [FIG. 18 A]. Subsequently, a fluorocarbon layer 63 is formed on hard mask layer 62 [FIG. 18 B]. Subsequently, fluorocarbon layer 63 is etched and patterned into a predetermined shape [FIG. 18 C]. A spacer $SiO_2$ layer 64 is formed to cover hard mask layer 62 exposed between fluorocarbon layer 63 and patterned fluorocarbon layer 63, as a silicon containing film layer [FIG. 18 D].

Figure 20:
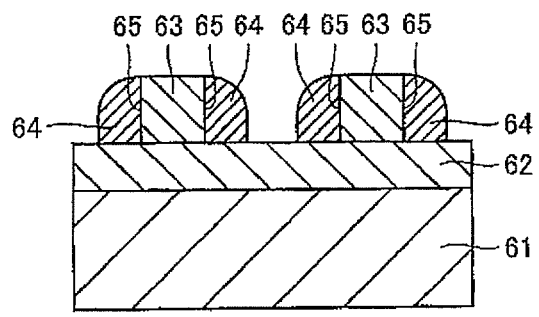
FIG. 20 is a schematic cross-sectional view illustrating a state where etching of a $SiO_2$ film is ended.

Subsequently, the $SiO_2$ layer is etched in such a manner that spacer $SiO_2$ layer 64 formed on the top side of fluorocarbon layer 63 and spacer $SiO_2$ layer 64 formed on the top side of the hard mask layer 62 are removed, while leaving spacer $SiO_2$ layer 64 located on a side wall 65 side of fluorocarbon layer 63 [FIG. 18 E]. FIG. 20 is a schematic cross-sectional view representing a state where the etching of $SiO_2$ layer is ended.

Figure 21:
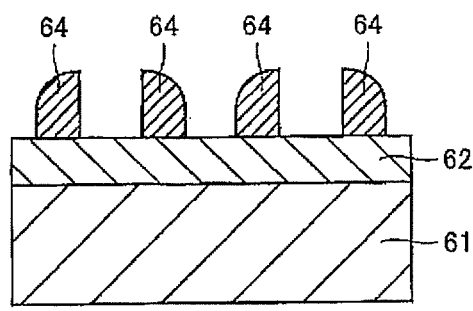
FIG. 21 is a schematic cross-sectional view illustrating a state where an etching of the fluorocarbon layer is ended.

Thereafter, an etching is performed to remove fluorocarbon layer 63 located between the remaining $SiO_2$ layer [FIG. 18 F]. By doing this, only spacer $SiO_2$ layer 64 formed on side wall 65 side of fluorocarbon layer 63 remaining after the etching remains on hard mask layer 62. FIG. 21 is a schematic cross-sectional viewer representing a state where the etching of the fluorocarbon layer is ended.

Figure 22:
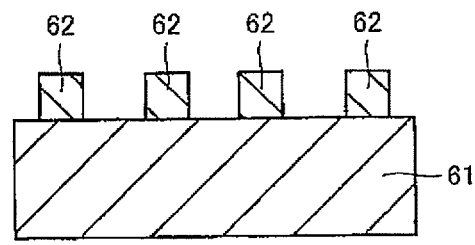
FIG. 22 is a schematic cross-sectional view illustrating a state where an etching of a hard mask layer is ended, using a $SiO_2$ film as a mask.

Hard mask layer 62 is etched using the remaining spacer $SiO_2$ layer 64 as a mask [FIG. 18 G]. FIG. 22 is a schematic cross-sectional view illustrating a state where the etching of a hard mask layer is ended using the $SiO_2$ spacer layer as a mask. Subsequently, the silicon substrate 61 is etched using the remaining hard mask layer 62 as a mask [FIG. 18 H].

That is, a substrate processing method according to another embodiment of the present invention includes: a hard mask layer forming process in which a hard mask layer is formed on a to-be-processed substrate; a fluorocarbon layer forming process in which a fluorocarbon (CFx: x is a random number) layer patterned into a predetermined shape is formed on the hard mask layer after the hard mask layer forming process; a silicon containing film forming process in which a silicon containing film is formed to cover the formed fluorocarbon layer and the hard mask layer exposed between the fluorocarbon layer layers after the fluorocarbon layer forming process; a silicon containing film etching process (etch back process) in which etching is performed to remove the silicon containing film located on the top side of the hard mask layer and on the top side of the fluorocarbon layer while leaving the silicon containing film located on a sidewall side of the fluorocarbon layer after the silicon containing film forming process; a fluorocarbon layer etching process in which an etching is performed to remove the fluorocarbon layer located between the side walls after the silicon containing film etching process; a hard mask layer etching process in which the hard mask is etched using the remaining silicon containing film as a mask after the fluorocarbon layer etching process; and a to-be-processed substrate etching process in which the to-be-processed substrate is etched using the remaining hard mask as a mask after the hard mask etching process.

When the $SiO_2$ film is formed at a high temperature, it becomes hardened and dense. Therefore, it is possible to maintain a high selection ratio and etch the $SiO_2$ film as in a designed shape. Here, since the fluorocarbon film, has a thermal resistance of about 400° C. when it is used, the $SiO_2$ film may be formed at a relatively high temperature. A technique for forming the $SiO_2$ film at such a relatively high temperature is disclosed in International Patent Publication WO 2009/139485. Further, since the fluorocarbon film also has a low thermal shrinkage value, even when the fluorocarbon as a core material is etched, a pattern (spacer) at the side wall side of the fluorocarbon layer may be suppressed from being pulled and fallen down towards the core material side. Accordingly, a subsequent etching processing may be accurately performed.

When an organic film, for example, a resist is used as the double patterning core material instead of the fluorocarbon layer, a thermal resistance is generally low. When doing as such, the $SiO_2$ film to be subsequently formed is also needed to be formed at a low temperature. By doing this, there may be a concern that the remaining $SiO_2$ spacer is fallen down during etching of the hard mask layer, its selection ratio in etching becomes lower, or an etching may not be performed as designed.

Further, a pattern forming method according to still yet another aspect of the present invention is a pattern forming method which forms a pattern at the time when a to-be-processed substrate is etched. The pattern forming method includes: a hard mask layer forming process in which a hard mask layer is formed on a to-be-processed substrate; a fluorocarbon layer forming process in which a fluorocarbon (CFx: x is a random number) layer patterned into a predetermined shape is formed on the mask layer after the hard mask layer forming process; a silicon containing film forming process in which a silicon containing film is formed to cover the formed fluorocarbon layer and the hard mask layer exposed between the fluorocarbon layers after the fluorocarbon layer forming process; a silicon containing film etching process in which etching is performed to remove the silicon containing film located on the top side of the hard mask layer and on the top side of the fluorocarbon layer while leaving the silicon containing film located on a side wall side of the fluorocarbon layer, after the silicon containing film forming process; and a pattern forming process in which the hard mask is etched to remove the fluorocarbon layer located between the side walls to form a pattern of the fluorocarbon layer at the time when the to-be-processed substrate is etched.

According to such a pattern forming method, it is possible to improve the reliability of processing while reducing the costs.

Further, a semiconductor element manufacturing method according to still yet another embodiment of the present invention is a semiconductor element manufacturing method in which a to-be-processed substrate is etched to manufacture a semiconductor element. The semiconductor element manufacturing method includes: a hard mask layer forming process in which a hard mask layer is formed on a to-be-processed substrate; a fluorocarbon layer forming process in which a fluorocarbon (CFx: x is a random number) layer patterned into a predetermined shape is formed on the formed mask layer after the hard mask layer forming process; a silicon containing film forming process in which a silicon containing film is formed to cover the formed fluorocarbon layer and the hard mask layer exposed between the fluorocarbon layers after the fluorocarbon layer forming process; a silicon containing film etching process (etch back process) in which etching is performed to remove the silicon containing film located on the top side of the hard mask layer and on the top side of the fluorocarbon layer while leaving the silicon containing film located on a side wall side of the fluorocarbon layer, after the silicon containing film forming process; a fluorocarbon layer etching process in which etching is performed to remove the fluorocarbon layer located between the side walls after the silicon containing film etching process; a hard mask layer etching process in which the hard mask is etched using the remained silicon containing film as a mask after fluorocarbon layer etching process; and a to-be-processed substrate etching process in which the to-be-processed substrate is etched using the remaining hard mask as a mask after the hard mask etching process.

According to the semiconductor element manufacturing method, it is possible to improve the reliability of etching process while reducing the manufacturing costs.

Further, a semiconductor element according to still yet another aspect of the present invention is manufactured by forming a hard mask layer on a to-be-processed substrate, forming a fluorocarbon (CFx: x is a random number) layer patterned into a predetermined shape on the hard mask layer, forming a silicon containing film to cover the formed fluorocarbon layer and the hard mask layer exposed between the fluorocarbon layers, forming an etching to remove the silicon containing film located on the top side of the hard mask layer and on the top side of the fluorocarbon layer while leaving the silicon containing film located on a side wall side of the fluorocarbon layer, performing an etching to remove the fluorocarbon layer located between the side walls, etching the hard mask using the remaining silicon containing film as a mask; and etching the to-be-processed substrate using the remained hard mask as a mask.

Such a semiconductor element may be fabricated highly reliably and inexpensively.

Further, in the embodiments described above, the hard mask layer is a SiN film, but not limited thereto, and may be other film.

Further, in the embodiments described above, the to-be-processed substrate is a silicon substrate, but not limited thereto, for example, the to-be-processed substrate, i.e., a film to be processed may be an interlayer film.

Further, in the embodiments described above, the fluorocarbon layer is formed by a plasma CVD [PE (Plasma Enhanced)-CVD], but not limited thereto, and the fluorocarbon layer may be formed by using other CVD method.

Further, in the embodiments described above, the plasma CVD process is performed using the $C_5F_8$ gas, but not limited thereto, and a fluorocarbon-based gas expressed by $C_yF_z$ (y and z are random numbers) such as $CF_4$, $C_2F_6$, and $C_4F_8$.

Further, as described above, a mixture of an etching gas containing any one of O (oxygen), Br (bromine), Cl (chlorine), F (fluorine), and N (nitrogen), and a noble gas, for example, Ar, for generating plasma, may be used as an etching gas in plasma etching.

Further, in the embodiments described above, a plasma processing is performed by a microwave of the radial line slot antenna using the slot antenna plate, but not limited thereto. The plasma processing may be performed by using a microwave plasma processing apparatus which radiates a microwave from a microwave plasma processing apparatus having a comb-shaped antenna unit or a slot to generate surface wave plasma. Further, the plasma processing is not limited to that using microwave, and may use other plasma, for example, a parallel plate type plasma, an inductively-coupled plasma (ICP), an electron cyclotron resonance (ECR) plasma, may be used.

Although the embodiment(s) of the present invention has (have) been described with reference to the drawings, the present invention is not limited thereto. The various changes, and modifications could be made to the embodiments within the scope or the present invention or within the scope equivalent thereto.

[Explanation of Symbols]

| | | | |
|---|---|---|---|
| 11 | plasma processing apparatus | 12 | processing container |
| 13 | gas supply unit | 14 | support rack |
| 15 | microwave generator | 16 | waveguide |
| 17 | coaxial waveguide | 18 | dielectric plate |
| 19, 41, 42 | slot | 20 | slot antenna plate |
| 21 | dielectric window | 22 | bottom portion |
| 23 | side wall | 24 | annular member |
| 25 | exhaust hole | 26 | O ring |
| 27 | a high frequency power supply | 28 | matching unit |
| 31, 34 | gas supply port | 32 | central gas supply unit |
| 33 | hollow member | 35 | outer gas supply unit |
| 36 | microwave matcher | 37 | central conductor |
| 38 | outer peripheral conductor | 39 | mode converter |
| 43 | slot pair | 44 | inner peripheral side slot pair group |
| 45 | outer peripheral side slot pair group | 46 | through hole |
| 47 | center | 48 | bottom surface |
| 49 | dielectric window concave portion | 51, 56, 61 | silicon substrate |
| 52, 62 | hard mask layer | 53 | organic film layer |
| 54 | antireflective coat layer | 55, 58 | resist layer |
| 57, 63 | fluorocarbon layer | 59a, 59b, 60a, 60b | point |
| 64 | SiO$_2$ film | 65 | side wall |

What is claimed is:

1. A substrate processing method, comprising:
a hard mask layer forming process in which a hard mask layer is formed on a to-be-processed substrate;
a fluorocarbon layer forming process in which a fluorocarbon (CFx: x is a random number) layer patterned into a predetermined shape is formed on the mask layer after the hard mask layer forming process;
a silicon containing film forming process in which a silicon containing film is formed to cover the formed fluorocarbon layer and the hard mask layer exposed between the fluorocarbon layers, after the fluorocarbon layer forming process;
a silicon containing film etching process (etch back process) in which an etching is performed to remove the silicon containing film located on the top side of the hard mask layer and on the top side of the fluorocarbon layer while leaving the silicon containing film located on a side wall side of the fluorocarbon layer after the silicon containing film forming process;
a fluorocarbon layer etching process in which an etching is performed to remove the fluorocarbon layer located between the side walls after the silicon containing film etching process;
a hard mask layer etching process in which the hard mask is etched using the remaining silicon containing film as a mask after fluorocarbon layer etching process; and
a to-be-processed substrate etching process in which the to-be-processed substrate is etched using the remaining hard mask as a mask after the hard mask etching process.

2. The substrate processing method of claim 1, wherein the silicon containing film includes a SiO$_2$ film.

3. The substrate processing method of claim 1, wherein the hard mask layer includes a SiN film.

4. A pattern forming method for forming a pattern at the time of etching a to-be-processed substrate, comprising:
a hard mask layer forming process in which a hard mask layer is formed on the to-be-processed substrate;
a fluorocarbon layer forming process in which a fluorocarbon (CFx: x is a random number) layer patterned into a predetermined shape is formed on the hard mask layer after the hard mask layer forming process;
a silicon containing film forming process in which a silicon containing film is formed to cover the formed fluorocarbon layer and the hard mask layer exposed between the fluorocarbon layers after the fluorocarbon layer forming process;
a silicon containing film etching process in which an etching is performed to remove the silicon containing film located on the top side of the hard mask layer and on the top side of the fluorocarbon layer while leaving the silicon containing film located on a side wall side of the fluorocarbon layer after the silicon containing film forming process; and
a pattern forming process in which the hard mask is etched to remove the fluorocarbon layer located between the side walls to form a pattern of the fluorocarbon layer at the time of etching the to-be-processed substrate after the silicon containing film etching process.

5. A semiconductor element manufacturing method for manufacturing a semiconductor element by etching a to-be-processed substrate, comprising:
a hard mask layer forming process in which a hard mask layer is formed on the to-be-processed substrate;
a fluorocarbon layer forming process in which a fluorocarbon (CFx: x is a random number) layer patterned into a predetermined shape is formed on the hard mask layer after the hard mask layer forming process;
a silicon containing film forming process in which a silicon containing film is formed to cover the formed fluorocarbon layer and the hard mask layer exposed between the fluorocarbon layers, after the fluorocarbon layer forming process;
a silicon containing film etching process (etch back process) in which an etching is performed to remove the silicon containing film located on the top side of the hard mask layer and on the top side of the fluorocarbon layer while leaving the silicon containing film located on a side wall side of the fluorocarbon layer after the silicon containing film forming process;
a fluorocarbon layer etching process in which etching is performed to remove the fluorocarbon layer located between the side walls after the silicon containing film etching process;

a hard mask layer etching process in which the hard mask is etched using the remaining silicon containing film as a mask after fluorocarbon layer etching process; and a to-be-processed substrate etching process in which the to-be-processed substrate is etched using the remaining hard mask as a mask after the hard mask etching process.

* * * * *